(12) United States Patent
Eymard et al.

(10) Patent No.: US 11,166,369 B2
(45) Date of Patent: Nov. 2, 2021

(54) LIGHT-EMITTING DEVICE AND METHOD FOR MANUFACTURING SAME

(71) Applicant: LINXENS HOLDING, Mantes la Jolie (FR)

(72) Inventors: Eric Eymard, Polignac (FR); Christophe Mathieu, Mantes la Jolie (FR); Jerome Deschamps, Aubiere (FR)

(73) Assignee: LINXENS HOLDING

( * ) Notice: Subject to any disclaimer, the term of this patent is extended or adjusted under 35 U.S.C. 154(b) by 0 days.

(21) Appl. No.: 16/321,324

(22) PCT Filed: Jul. 28, 2017

(86) PCT No.: PCT/FR2017/052130
§ 371 (c)(1),
(2) Date: Jan. 28, 2019

(87) PCT Pub. No.: WO2018/020185
PCT Pub. Date: Feb. 1, 2018

(65) Prior Publication Data
US 2019/0174625 A1   Jun. 6, 2019

(30) Foreign Application Priority Data

Jul. 28, 2016   (FR) ...................................... 1657333

(51) Int. Cl.
*F21V 19/00*       (2006.01)
*F21V 21/002*      (2006.01)
(Continued)

(52) U.S. Cl.
CPC .............. *H05K 1/0296* (2013.01); *F21S 4/20* (2016.01); *F21S 4/22* (2016.01); *F21S 4/24* (2016.01);
(Continued)

(58) Field of Classification Search
CPC ................. H05K 1/0296; H05K 1/181; H05K 2201/10106; F21V 19/0025; F21V 21/002; F21V 21/35; F21S 4/20–26
See application file for complete search history.

(56) References Cited

U.S. PATENT DOCUMENTS

| | | | |
|---|---|---|---|
| 4,774,642 A * | 9/1988 | Janko ................... | A41D 27/085 362/103 |
| 2003/0010065 A1 | 1/2003 | Keogh | |

(Continued)

FOREIGN PATENT DOCUMENTS

| | | |
|---|---|---|
| DE | 102012221250 A1 | 5/2014 |
| EP | 2991460 A1 | 3/2016 |

*Primary Examiner* — Sean P Gramling
(74) *Attorney, Agent, or Firm* — Forge IP, PLLC

(57) ABSTRACT

A light radiation emitting device including at least one LED-type device capable of generating a light radiation in a predefined wavelength range and having two electrical contact pads, and a support delimited by first and second opposite sides defining together a thickness of the support, the support supporting at least one LED luminous device and at least one conductive electric track. The electric track is formed of conductive wires. All or part of the conductive wires are bonded to the support along all or part of their length. All or part of the conductive wires have at least one contact portion exposed towards at least one of the first and second sides of the support. Each of the contact pads of the LED-type device is positioned opposite a contact portion of one of the conductive wires and is electrically connected to the contact portion.

10 Claims, 7 Drawing Sheets

(51) Int. Cl.
  *F21S 4/20*  (2016.01)
  *H05K 1/02*  (2006.01)
  *H05K 3/10*  (2006.01)
  *H05K 3/32*  (2006.01)
  *H05K 1/18*  (2006.01)
  *F21V 21/35* (2006.01)
  *F21S 4/24*  (2016.01)
  *F21S 4/26*  (2016.01)
  *F21S 4/22*  (2016.01)
  *H05K 1/11*  (2006.01)

(52) U.S. Cl.
  CPC ........... *F21S 4/26* (2016.01); *F21V 19/0025* (2013.01); *F21V 21/002* (2013.01); *F21V 21/35* (2013.01); *H05K 1/0203* (2013.01); *H05K 1/028* (2013.01); *H05K 1/111* (2013.01); *H05K 1/181* (2013.01); *H05K 1/183* (2013.01); *H05K 3/103* (2013.01); *H05K 3/328* (2013.01); *H05K 2201/0129* (2013.01); *H05K 2201/10106* (2013.01); *H05K 2201/10287* (2013.01); *H05K 2203/0285* (2013.01)

(56) References Cited

U.S. PATENT DOCUMENTS

| | | | |
|---|---|---|---|
| 2004/0041222 A1* | 3/2004 | Loh | H01L 33/58 257/433 |
| 2004/0051171 A1* | 3/2004 | Ng | H01C 1/14 257/690 |
| 2005/0239342 A1* | 10/2005 | Moriyama | F21K 9/00 439/699.2 |
| 2006/0186423 A1* | 8/2006 | Blonder | H01L 25/0753 257/98 |
| 2010/0116526 A1 | 5/2010 | Arora et al. | |
| 2014/0209942 A1 | 7/2014 | Dingemans et al. | |
| 2014/0268607 A1 | 9/2014 | Wicker et al. | |
| 2015/0129909 A1 | 5/2015 | Speer et al. | |

\* cited by examiner

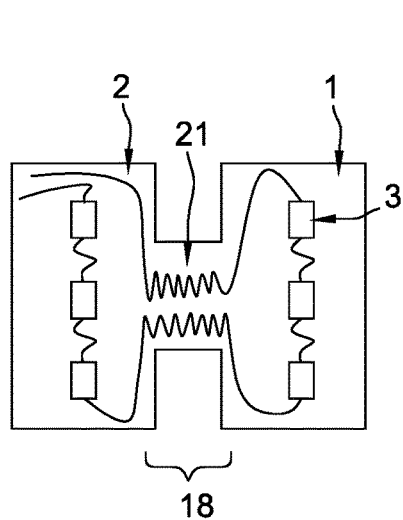
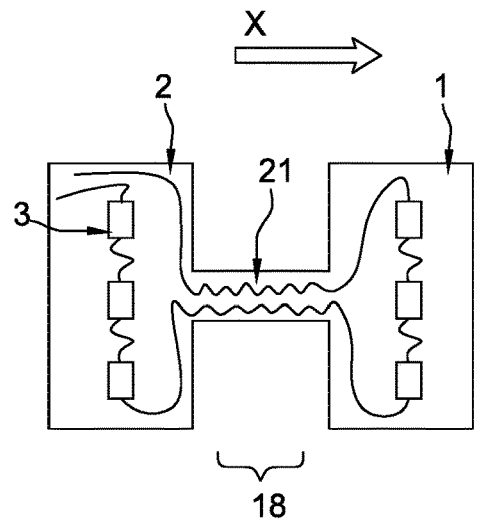
Fig. 9A    Fig. 9B
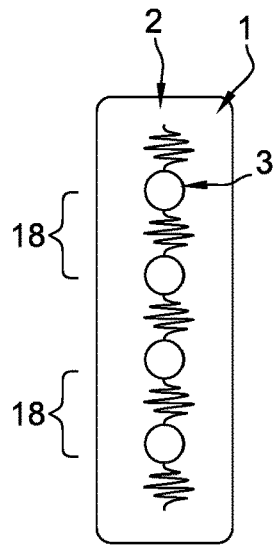
Fig. 10A
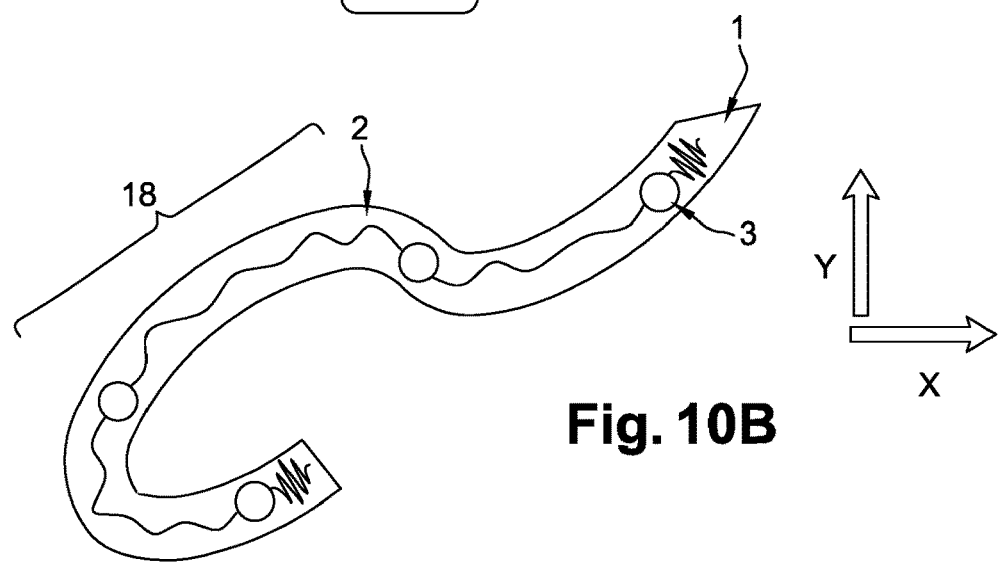
Fig. 10B

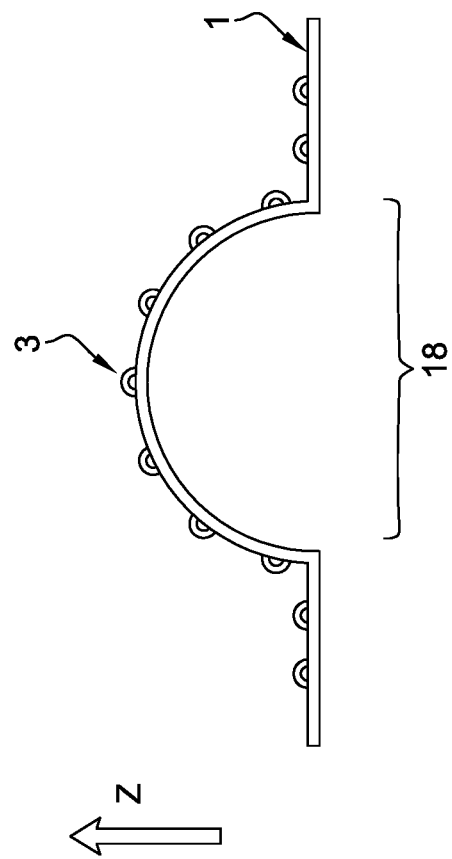
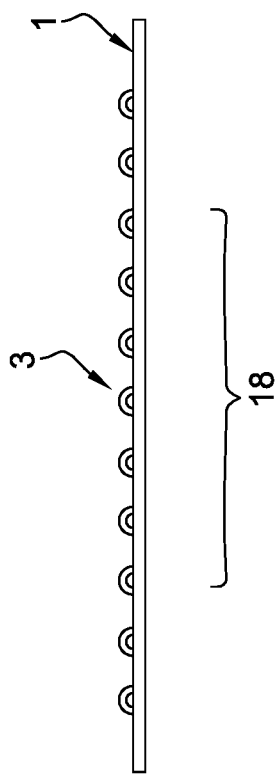

LIGHT-EMITTING DEVICE AND METHOD FOR MANUFACTURING SAME

TECHNICAL BACKGROUND

The invention relates to a light radiation emitting device where LED luminous devices formed of light-emitting diodes (LED) are assembled on a printed circuit.

PRIOR ART

In simplified fashion, a LED (for "Light Emitting Diode") chip conventionally comprises at least one p-n junction formed between an area of semiconductor material doped according to a p-type doping and an area of semiconductor material doped according to an n-type doping. Electric connection terminals coupled to each of the doped areas enable to power the LED by injection of a current and thus to emit a light radiation in a wavelength range. Further, the LED chip may be associated with phosphors or luminophores capable of absorbing part of the light radiations emitted by the LED and of emitting light radiations in another wavelength range.

A plurality of types of LED chip configurations, which essentially differ by the LED power supply method and particularly by the arrangement of the electric connection terminals, can be distinguished.

In a first so-called "vertical" configuration, the p and n semiconductor areas are formed on the two opposite sides of an electrically-conductive base. The assembly forms a stack topped with a first electric connection terminal, the base forming the second electric connection terminal. Thus, in such a configuration, the current crosses the entire stack, including the base.

In a second so-called "horizontal" configuration, the connection terminals are necessarily formed on the two doped areas. In particular, the semiconductor p and n areas are formed on a same side of a base, generally a growth substrate having a low electric conductivity. In practice, the connection terminals are arranged substantially on a same plane or slightly shifted vertically (or across the thickness of the areas), so that the current crosses the active area of the semiconductor without crossing the base having a low conductivity.

In a first so-called "flip-chip" configuration, the electric power supply of the chip is provided by electrically-conductive solder bumps arranged on a same plane to avoid the use of connection wires.

Conventionally, one or a plurality of LED chips may be arranged on one side of a substrate and may be encapsulated, possibly with phosphors or luminophores, in an encapsulation body, for example made of silicone resin, to form a LED module. Contact pads electrically coupled to the electrodes of the LED chips are then generally provided on the substrate to allow the electric connection of the LED module to other components of a circuit.

Further, such LED-type devices, that is, LED chips or LED modules, are generally transferred onto a printed circuit formed of a support having electrically conductive tracks routed thereon according to a predefined interconnection pattern.

For example, to form a flexible printed circuit adapted to the transfer of LED chips or modules, the conductive tracks may be formed by lamination of a conductive film on a surface of a flexible support, followed by a chemical etching of this film. However, such a routing technique borrowed from subtractive techniques only authorizes very limited patterns since a pattern including a track overlap is not permitted. Further, it does not enable to etch tracks on very large surfaces.

A similar solution comprises forming the conductive tracks by mechanical cutting of the conductive film before the lamination rather than by chemical etching after the lamination on a surface of the support. Such a leadframe routing technique has in fine the same limitations as the chemical etching technique.

Another solution borrowed from additive technologies comprises using conductive ink printed on the support. Such a solution however has a poorer performance since inks have a lower conductivity than metals. Since the conductivity of the tracks depends on the thickness of the deposited ink film, it is sometimes necessary to apply a plurality of successive ink layers, making the solution more expensive. Further, according to the quality of the ink and of the printing, the track density of the printed circuit is not optimal. Further, like routing by etching, silk screening does not easily authorize the overlapping of tracks since at least three successive printing sequences are necessary to form an insulating bridge.

The mounting of the LED devices on the printed circuit may be obtained by collective soldering including at least one passage in a furnace, after the placing of the LED devices on the printed circuit. Such a technique however limits the use to a certain type of material for the flexible support and may cause damage to certain components due to the use of a relatively high melting temperature (typically in the range from 250 to 350° C.). Another solution comprises implementing a wire bonding technique which however requires a large number of manipulations and generates a non-negligible thickness on the printed circuit.

Another major issue of LED devices assembled on a printed circuit is the discharge of the heat generated by the LED. A poor heat dissipation may in particular cause a premature aging of the components as well as a drop in the system efficiency. Conventionally, the heat dissipation may be ensured by the actual conductive tracks, but such a heat management is not optimal, particularly for LED chips with a strong power supply current which requires a larger heat exchange surface area than that provided by the conductive tracks. A solution then comprises adding to the circuit more or less bulky and more or less expensive heat sinks.

SUMMARY

In this context, the present invention thus aims at providing an alternative solution for the forming of a device emitting a light radiation at one or a plurality of wavelengths, free from the above-listed disadvantages.

In particular, the present invention aims at providing a novel solution for the routing of conductive tracks on a flexible or rigid support adapted for the electric interconnection of LED-type devices, such as LED chips or LED modules. Further, the present invention also aims at providing a less complex solution allowing the routing of a larger density of conductive tracks on a flexible or rigid support, as well as a greater flexibility in terms of interconnection patterns. The present invention also provides a solution which allows a routing on larger surfaces, as well as a greater density of LED modules, while decreasing the general bulk of the assembly. The present invention also offers the possibility of assembling a small number of LED devices on a very large support surface at a lower cost.

Another object of the invention is to provide a solution which is less bulk and less expensive for the heat dissipation of LED devices assembled on a printed circuit. In particular, the present disclosure provides a modularity in the means which may be implemented for heat dissipation.

The invention thus aims at a device emitting a light ray, visible or not, comprising at least one LED-type device and a support which may for example be flexible or rigid. The LED-type device is capable of generating a light radiation in a predefined wavelength range, and comprises at least two electrical contact pads. The support is delimited by first and second opposite sides defining together a thickness of the support. The support supports at least the LED luminous device and at least one electrically conductive track.

According to the invention, the electric track is formed of conductive wires bonded to the support along all or part of their length. All or part of the conductive wires have at least a contact portion exposed or free towards at least one of the first and second sides of the support. Further, each of the contact pads of the LED-type device is positioned opposite a contact portion of one of the conductive wires and is electrically connected to this contact portion.

Thus, the solution of the invention comprises routing the conductive tracks on a support, which may be flexible or not, by positioning and attaching simple conductive wires to the support. Such conductive wires preferably extend substantially in a same plane substantially parallel to one of the first or second sides of the support. The conductive wires are particularly calibrated according to their use. For example, the conductive wires may be intended for the electric power supply of the LED device(s), for the electric interconnection of a LED device with other LED devices or with other components, for data transmission, or also for the forming of a passive electric component or for the forming of a heat sink. In particular, certain conductive wires have one or a plurality of contact portions distributed along the wire. Such contact portions are particularly intended to be directly connected to the contact pads of the LED devices. Accordingly, the routing of the conductive tracks, the electric connection of the LED-type devices to the support, as well as the electric interconnection between a plurality of LED-type devices assembled on the support, are thus simplified.

According to an embodiment of the invention, said support of the emitter device of the invention may have at least one area deformable in at least one deformation direction, a portion of at least one of said conductive wires being positioned in said stretchable area according to a pattern authorizing the deformation of said deformable area and of the conductive track in said deformation direction, without inducing a breakage of the conductive wires routed on the support. The deformation of the area may in particular correspond to a stretching/elongation, twisting, or also contraction in one or a plurality of directions of space.

Preferably, all or part of the conductive wires have a portion positioned according to said pattern authorizing the deformation and a contact portion, the two types of portions being different from one another. Preferably, the pattern authorizing the deformation is obtained with no discontinuity of the conductive wire. In other words, the conductive wires having the two types of portions may be used both to provide the electric conduction but also to provide a better flexibility or resilience of the conductive track. Thus, the conductive track can follow the potential deformations of the support with no risk of line breakage, that is, the function relative to the electric conductivity of the conductive wire is kept even after the deformations, that is, stretchings and/or contractions and/or twisting of the support, due to a shaping of the emitter device of the invention.

In practice, it can be envisaged to position the conductive wires according to a pattern authorizing a deformation such as defined hereabove, of the deformable area of said support by a few millimeters per area, for example, a deformation greater than 2 cm over 4 deformation areas, without causing a line breakage. Such patterns may for example be of the type exhibiting at least one curve, such as for example, of zigzag, circle, or spiral type. Of course, other patterns can be envisaged according to the desired deformation strain of the support.

Thus, it is quite possible to envisage to first form the luminous device such as described hereabove by positioning the assembly of the conductive tracks and of the LED-type devices on the support and to then deform the luminous device thus obtained to obtain a volume structure, for example, by molding or thermoforming. The patterns authorizing the deformation provide the conductive track with a better resistance to deformation strain while avoiding the line breakage.

According to an embodiment, all or part of the conductive wires may be positioned within the thickness of the support. In particular, the cross-section of each conductive wire may be entirely or partly positioned within the support thickness. In other words, the wire may be integrally arranged within the support thickness, or be flush with the support surface, or slightly protrude from this surface.

According to a variation of this embodiment, each conductive wire may be embedded or inlaid within the support thickness from an embedment surface formed by the first or the second side of the support. Further, the contact portions of each conductive wire are preferably exposed towards at least this embedment surface for this wire.

Thus, the solution according this variation comprises routing the conductive tracks on a support, which may thus be flexible or not, by embedding or inlaying conductive wires within the thickness of this support. In other words, all or part of the conductive wires are housed, along their entire length or along a large portion of their length, within the support. The depth of the embedment within the support thickness may be such that all or part of the conductive wires have at least a contact portion exposed or free towards the embedment surface and intended to be coupled or directly connected to the contact pads of the LED-type devices. The routing of the conductive wires via an embedding technique is advantageous to solidly bond or attach the wires to the support.

This variation enables, in particular, to position the LED device(s) in a plurality of ways on the support.

For example, the LED device may be positioned on the support surface, and more specifically on the corresponding embedment surface for the wire having the LED device connected thereto. Thus, the contact pads may run over or under the contact pads of the LED device.

Of course, it is possible to route the support on its first and second sides and to assemble LED-type devices on these two sides to obtain an emitter device emitting radiations in a plurality of directions and particularly from the two sides of the support. Advantageously, the support may thus comprise, on its first side, at least one first conductive track and at least one LED-type device electrically connected to the first conductive track and, on its second side, at least another LED-type device electrically connected to the first track and/or possibly to one or a plurality of other conductive tracks of the second side.

For example, the LED device may also be positioned in a housing or cavity formed within the support thickness, which housing may be through or not. Thus, the support may be provided with at least one housing open on at least one of the sides of the support, the housing comprising at least the LED-type device and at least the contact portions having the LED-type device connected thereto. Advantageously, the housing may also be open on the surface of embedment of the wire that it receives. Similarly, the contact pads may run over or under the contact pads of the LED device. As previously, it is possible to provide housings on the two opposite sides of the support and to route the two opposite sides to obtain a device emitting radiations in a plurality of directions and in particular from the two sides of the support.

The housing may also be through, that is, open on the two opposite sides of the support. In this specific case, it is possible to position one or a plurality of LED devices in the housing. Further, each LED device may be assembled to emit towards one or the other of the sides of the support. It is thus possible to form an emitter device emitting radiations from the two sides of the support. This solution particularly enables to decrease the bulk and to form thin and flexible luminous objects emitting in a plurality of directions.

Thus, in practice:
the contact portions may be exposed on at least the first side of the support and particularly the embedment surface or made available to be electrically connected according to the envisaged electric diagram;
the contact portions may also be exposed in a housing formed within the support;
the contact portions may be exposed on the two opposite sides of the support, particularly when the housing is through, that open on the two opposite sides of the support.

Of course, a combination of these variations is also possible on a same support. The emitter device may comprise a plurality of LED devices, each of which may be assembled to the support according to one of the above-disclosed variations. Of course, it is possible to combine the different variations on a same support.

Further, the routing of the conductive tracks and the assembly of the LED device onto the support may be carried out in several ways. In particular, it is possible to fasten the LED device to the support before performing the routing of the tracks, and it is also possible to form the conductive tracks on the support before the assembly of the LED device on the support. It should thus be understood that the solution of the invention comprising implementing the embedding of conductive wires provides a very large flexibility in the manufacturing process. Thus, the contact portions and the contact pads may be interconnected by any means, such as for example those described hereafter, for example, by gluing, by a thermocompression bonding technique or also by snap coupling of the contact portions with the contact pads.

According to another variation of this embodiment, the support may be formed of two substrates enclosing the conductive wires. In other words, the conductive wires are sandwiched between the two substrates forming the support.

In practice, to let out the light radiation emitted by the LED device, at least one of the two substrates comprises at least one recess enabling to expose the contact portions and to electrically connect the contact pads of the LED device, the LED device being positioned within the recess.

In practice, it is also possible for at least one of the two support substrates to have optical properties, for example, to be transparent for the radiation emitted by the LED device, or also to be scattering for a homogeneous scattering of the radiations.

According to another embodiment, the conductive wires are laid on one of the first and/or second surfaces of the support and are bonded to this surface.

In other words, the routing of the conductive track is obtained by simple laying of the conductive wires on the support, for example by gluing, according to a predefined interconnection pattern. According to another variation, the routing of the conductive track may be obtained by lamination of a conductive track previously formed by cutting of a conductive film according to an electric diagram including said pattern authorizing deformation.

To provide a better bonding of the wires to the support, it is possible enclose the conductive wires and the LED-type device between the support and a holding layer or plate. As previously, the holding layer may cover the entire surface of the support and have, in this case, optical properties allowing, in particular, the scattering of light radiations emitted by the LED device, or also be provided with recesses to let out the radiations.

This solution particularly has the advantage of enabling to use supports having a very large surface area and to form objects at a low cost.

The solutions provided hereabove thus offer a very large flexibility as to the layout of the LED devices on the support and as to the variety and to the number of LED devices which may be assembled on a same support.

In particular, the LED-type device may comprise one or a plurality of LED chips or one or a plurality of packaged LEDs, each integrating at least two electrodes forming contact pads. Each of these electrodes is electrically connected to one of the contact portions of the conductive wires.

Advantageously, the LED chip may first be positioned on the support of the emitter device according to one of the above-described variations, and connected to the contact portions according to one of the ways disclosed hereabove, and then encapsulated in an encapsulation body. The encapsulation body, which may be made up of silicone resin, thus preferably covers at least the LED chip and part of the conductive wires connected to the LED chip. In practice, at least one phosphor material may also be arranged in the encapsulation body with the LED chip. Scattering particles and/or luminophores may also be integrated in the silicone resin. Of course, a plurality of LED chips may be arranged in a same encapsulation body.

For example, the LED device may be a LED chip, typically with a "horizontal" configuration, comprising two electrodes formed on a same side of an electrically-insulating base. Such electrodes thus form the two contact pads mentioned hereabove and are each electrically connected to one of the contact portions.

The LED-type device may also comprise a LED module integrating one or a plurality of packaged LEDs or also one or a plurality of LED chips associated or not with phosphors (or luminophores) arranged on a substrate, each LED chip being encapsulated in a common or different encapsulation body, the two contact pads of each LED chip being positioned on the substrate and being electrically coupled to the electrodes of the LED chip. As previously, the LED module may be positioned on the support according to one of the above-described variations, and connected to the contact portions according to one of the ways disclosed hereabove. Of course, LED modules based on LED chips having a "vertical" or "flip-chip" configuration may also be used.

Of course, the solution disclosed hereabove also enables to assemble a plurality of LED-type devices and/or a plurality of other electronic components on the support, interconnected by means of the conductive track.

Thus, all or part of the LED devices may be assembled in series and/or in parallel, and each conductive wire may in particular be continuous and/or discontinuous between two or a plurality of contact pads according to the desired electric diagram.

It can thus be understood that the solution of the invention comprising using conductive wires, such as for example copper wires, which may be routed by embedding or by simple gluing, provides a very large flexibility in the manufacturing process, in the selection of the support material, in the interconnection pattern, as well as in the density of LED devices assembled to the support.

Further, another advantage of the use of conductive wires lies in the fact that it is possible to form passive electric components by means of at least one of the conductive wires of the conductive track. For example, it is possible to form a resistor by winding of one of the conductive wires. Further, it is also possible to form a heat sink or radiator by means of at least one of the conductive wires or another dedicated wire embedded within the support via the same technique. Thus, advantageously, the conductive track may comprise at least a resistor and/or a heat sink formed by at least one of the conductive wires. Certain conductive wires of the conductive track may be specifically used to form resistors or heat sinks, particularly via dense windings. However, a same wire may be used to form one or a plurality of resistors and/or one or a plurality of heat sinks as well as one or a plurality of contact portions enabling to electrically interconnect a plurality of LED devices.

Such advantages and possibilities cannot be found in techniques conventionally used for the routing on a support, that is, etching, cutting, or conductive ink deposition, for the forming of a printed circuit adapted to the assembly of LED devices.

Further, independently from heat dissipation via the conductive wires, it is possible to provide one or a plurality of specific thermal pads, based on a heat-conducting material, to be arranged on the support. For example, a thermal pad may be obtained by the deposition of a heat-conducting layer on all or part of the support surface, or also in the housings, when present. For example, it is possible to glue one or a plurality of sheets based on a heat-conducting material on the support. It is also possible to provide thermal plates to be arranged in contact or not with one or a plurality of contact portions to offer a larger heat exchange surface area to LED devices. Such thermal pads may be bonded to the contact portions by different means, such as for example those described hereafter for the connection of the contact pads of LED devices, for example, by thermocompression bonding or by a glue dot.

In practice, the embedding of conductive wires within the support thickness may be performed according to an ultrasound method where vibrations are generated by ultrasounds and are applied to the conductive wires. Another incrustation technique may comprise forming grooves across the support thickness from one of the opposite sides of the support, and then inserting all or part of the conductive wires in the grooves. Preferably, at least the contact portions of the conductive wires may be flush with the first surface of the support or may slightly protrude from this surface.

Further, the electric connection of the contact pads of the LED-type device with the contact portions of the conductive wires may be performed by means of a thermocompression bonding ("TCB"). Of course, it is possible to envisage other techniques, such as for example the use of drops of conductive glue, of an isotropic or anisotropic adhesive conductive film ("ACF" in the form of a wire or "ACP" in the form of paste), or of solder paste. It is also possible to envisage a bonding and a connection of the contact portions to the contact pads via a system of snap coupling of the contact portions with the contact pads. For example, each contact pad may integrate a pin having the contact portion engaging therewith.

In particular, most LED chips or modules generally exhibit contact pads having dimensions which are not adapted for the implementation of the thermocompression bonding technique, particularly when the conductive tracks have been formed by the wire embedding technique or by gluing of the wires. It is thus necessary to provide a specific support which is capable of receiving one or a plurality of LED chips or modules and which is adapted for an electric connection onto the conductive track, for example, via one of the above-defined connection techniques. Thus, the present invention also aims at a support for a LED device capable of being assembled to the support of the above-described light-emitting device. The LED device support comprises, in particular, a substrate capable of receiving at least one LED chip, packaged or not, or one LED module. The substrate comprises at least one reception structure and at least one pair of connection structures. The reception structure receives one or a plurality of LED chips or one or a plurality of LED modules. Each connection structure is formed of at least one first portion forming one block with a second portion. The first portion is electrically coupled to one of the electrodes of the LED chip or of the LED module, and the second portion forms a contact pad intended to be directly connected, for example by means of a thermocompression bonding, to a conductive wire of a conductive track. Thus, the reception structure may receive a plurality of LED chips, packaged or not, emitting substantially in a same wavelength or in different wavelengths. Of course, the shape and the size of the reception and connection structures may vary according to the application or to the LED density on the support. Further, the number of connection structures may also vary. Thus, it is possible to provide a pair of connection structures common to all LED chips, or a plurality of pairs of different connection structures. For example, a first portion common to all or part of LED chips and modules, or different first portions of the connection structure for the LED chips or modules, can be envisaged. For example, a second portion common to all or part of the LED chips and modules, or different second portions for the LED chips or modules, can also be envisaged. The use of this type of LED support associated, in particular, to the routing by embedding or gluing enables to have a much greater LED density on the support of the luminous device of the invention. According to a variation, the substrate has one central structure and two lateral structures, said central structure receiving at least the LED chip or module, each lateral structure being formed of a first portion forming one block with a second portion, the second portion being electrically coupled to one of the electrodes of the LED chip, and the second portion forming the contact pad and being connected to one of the contact portions of one of the conductive wires of the conductive track.

For example, the emitting device of the invention may comprise a LED-type device formed of the LED device support disclosed hereabove and one or a plurality of LED chips or modules arranged on the reception structure, and connected to the first portions of the connection structures. The second portions of the connection structure thus form the contact pads connected to the contact portions of the conductive track.

In practice, the conductive wires may be made up of a metallic material. As an example, the conductive wires may for example be made of copper, gold, aluminum, silver, or of an alloy based on at least one of these metals. It is also possible to envisage using any other type of wires made up of an electrically-conductive material, such as for example wires made up of carbon, particularly of graphite. Further, each conductive wire may have any cross-section, particularly parallelepipedal or round. For example, the diameter of the cross-section of the conductive wire may typically be in the order one tenth of a millimeter, for example 80 or 120 µm. In practice, each conductive wire is sized to adapt to the use for which the wire is intended. Conventionally, each conductive wire may be sized according to the electric diagram to be routed in the support, to the different components to be interconnected, to the intensity of the current, or to the power to convey. Thus, it is possible to have, on a same support, conductive wires of different dimensions, such as wires adapted for lower or higher electric powers, or also wires intended for data transmission, or also wires adapted to the forming of resistors or of heat sinks.

Further, each conductive wire may be covered or not with an insulating sheath. When the conductive wire is covered with an insulating layer, the contact portions intended to be connected to the contact pads of the LED device are preferably deprived of the insulating layer. In other words, the sheathed conductive wire may comprise one or a plurality of clearly distinct contact portions. The use of a sheathed conductive wire enables, in particular, to form patterns including the overlapping of the wires. As an example, conductive wire made of enameled copper may be used. In practice, it is possible to provide a specific step of removal of the insulating layer from the contact portions, by for example implementing mechanical or chemical removal techniques. As an example, the insulating layer may be removed by abrasion, dissolution, or sublimation at an adapted temperature.

The conductive wires may also be coated with a finishing coat intended to increase the reflectivity. As an example, the finishing coat may be made of gold, silver, aluminum, copper, palladium, or of an alloy based on one of these metals.

Different materials may be used for the support of the emitter device of the invention. Preferably, the support is made of a flexible or rigid electrically-insulating material. As an example, the support may be made of a material made up of epoxy, for example, of glass-epoxy, or made up of thermoplastic polymer, for example, of polyvinyl chloride (PVC) mixed or not with acrylonitrile butadiene styrene (ABS), of polyester or polyimide. The materials described in document US 2014/0268607A1 can also be envisaged. For example, the use of an elastomer material enables, in particular, to obtain an emitting device having a low sensitivity to vibrations. Further, to increase the reflectivity, the support may be mass-dyed white, coated with a mirror-effect finishing coat, for example, with an alloy based on nickel, gold, palladium, silver, etc.

Advantageously, the support may also be made of a thermoformable material to obtain objects having different shapes and volumes. In particular, the support made of thermoformable material may comprises one or a plurality of conductive tracks such as disclosed hereabove and one or a plurality of LED-type devices electrically interconnected via the conductive tracks. In this specific case, the shaping of the support may be performed before or after the routing of the conductive tracks on the support, for example, via the implementation of an embedding technique adapted to 3D shapes. Further, the LED devices may be laid before or after the shaping.

Advantageously, the support may be a flexible deformable support of thermoplastic elastomer (TPE) type. Since such TPE supports particularly enable to perform luminous textile weavings which can thus adapt to different curvatures and particularly be deformable in different directions of space.

It is thus possible to obtain a mechanical part integrating at least one light radiation emitting device described hereabove.

In practice, an emitting device such as described hereabove may also comprise a keying system configured to allow a correct positioning of the LED-type devices on the support. Such a keying may for example be located on said support of the emitting device or also on said LED device support. Further, the keying device may be in the form of a perforation having a specific shape on the support of the emitting device, or of a color code, or also result from a specific shape of the LED device support enabling to differentiate the connection structures from one another.

Generally, the method of manufacturing the above-described light radiation emitting device may comprise:

forming at least one conductive track by bonding or attaching conductive wires to a support along all or part of their length and according to an interconnection pattern, the support being delimited by first and second opposite sides defining together a thickness of the support, all or part of the conductive wires having at least one contact portion exposed towards at least one of the first and second sides of the support;

assembling and connecting to the conductive track at least one LED-type device capable of generating a light radiation in a predefined wavelength and comprising two electrical contact pads, each of the contact pads of the LED-type device being placed opposite a contact portion of one of the conductive wires and being electrically connected to said contact portion.

As explained hereabove, the solution of the invention allows a certain flexibility in the manufacturing method.

According to an embodiment of the invention, the forming of the conductive track comprises forming on the support an area deformable in at least one deformation direction and a portion of at least one of said conductive wires is positioned according to a pattern authorizing the deformation of said deformable area and of the conductive track in said deformation direction with no breakage of the conductive wires.

According to an embodiment, the bonding of the conductive wires to the support is obtained by embedding of the conductive wires within the support thickness from one of the first and second sides of the support.

According to another embodiment, the bonding of the conductive wires is obtained by gluing of the conductive wires to one of the first and second sides of the support.

According to a variation, the conductive track is formed before the assembly and the electric connection of the LED device to the conductive track.

According to another variation, the assembly of the LED-type device to the support is performed before the forming of the conductive track and the connection of the contact portions of the conductive wires to the contact pads.

Advantageously, the method further comprises forming at least one housing within the support thickness, the housing being at least open on one of the first and second sides of the support and comprising at least the LED-type device and the contact portions to which the LED-type device is connected.

Practically, according to a version, the manufacturing method may thus comprise the steps of:
- first, forming the conductive track by embedding of conductive wires within the support thickness according to a predefined interconnection pattern;
- then, assembling and electrically connecting the LED device(s) to the support and particularly to the conductive track.

Practically, according to another version, the manufacturing method may thus comprise the successive steps of:
- first, assembling the LED-type device(s) to the support;
- then, forming the conductive track by embedding of conductive wires within the support thickness according to a predefined interconnection pattern, including connecting the contact portions of the conductive wires to the contact pads of the LED-type devices.

According to still another version, the manufacturing method may comprise the steps of:
- first, forming one or a plurality of housings within the support thickness, the housing(s) being open on the first side of the support;
- assembling the LED device(s) to the support, each LED device being arranged on the surface of the first side of the support or in one of the housings;
- forming the conductive track by embedding of conductive wires within the thickness of the support according to a predefined interconnection pattern, each conductive wire comprising at least one contact portion connected to one of the areas of one of the LED luminous devices.

According to still another version, the manufacturing method may comprise the steps of:
- forming one or a plurality of housings across the thickness of the support, each housing being intended to receive at least one LED device, that is, a LED module or chip;
- forming the conductive track by embedding of conductive wires across the thickness of the support according to a predefined interconnection pattern, all or part of the housings being preferably interconnected;
- assembling the LED device(s) in the housings, and electrically connecting each LED device to contact portions.

According to still another embodiment, the manufacturing method may comprise the steps of:
- forming the conductive track by embedding of conductive wires within the support thickness according to a predefined interconnection pattern;
- assembling and electrically connecting the LED device(s) to the support and particularly to the conductive track, each LED device being a LED chip;
- depositing an encapsulation layer on the support covering at least the LED chip and part of the conductive wires connected to the LED chip.

The encapsulation body may be formed by the deposition of silicone resin drops or also by the deposition of a film. As an example, the deposition of the film by silk screening or by a hot lamination technique can be envisaged. Preferably, luminophores are arranged on the support and in the encapsulation body. Preferably, luminophores are integrated in the encapsulation body.

The light radiation emitting device thus obtained may be directly used or may be incorporated in other objects. For example, it may be cut, manually shaped or shaped by thermoforming, or also overmolded to form more massive parts incorporating luminous devices, for example, luminous bumpers. Of course, a support made of a material adapted to the overmolding technique is advantageously used.

BRIEF DESCRIPTION OF THE DRAWINGS

The foregoing and other features and advantages of the present invention will be discussed in detail in the following non-limiting description, in connection with the accompanying drawings, among which:

FIGS. 9A, 10A, and 11A are simplified representations of a light-emitting device according to different embodiments where the conductive track has stretchable areas, the support being in non-stretched configuration;

FIGS. 9B, 10B, and 11B are simplified representations of the light-emitting devices of FIGS. 9A, 10A, and 11A, respectively, after deformation of the support.

It should be noted that in the drawings, the same reference numerals designate the same or the like elements and that the different structures are not to scale. Further, only those elements which are indispensable to the understanding of the invention are shown in the drawings for clarity.

DETAILED DESCRIPTION OF EMBODIMENTS OF THE INVENTION

Certain specific above-described embodiments of a printed circuit by the use of conductive wires bonded to a support, by gluing or by embedding of the wires on or within the thickness of the support, for the forming of conductive tracks according to a predefined interconnection pattern and in order to interconnect a plurality of components, particularly, LED-type devices, such as LED modules or LED chips, will be described hereafter.

Figure 1:
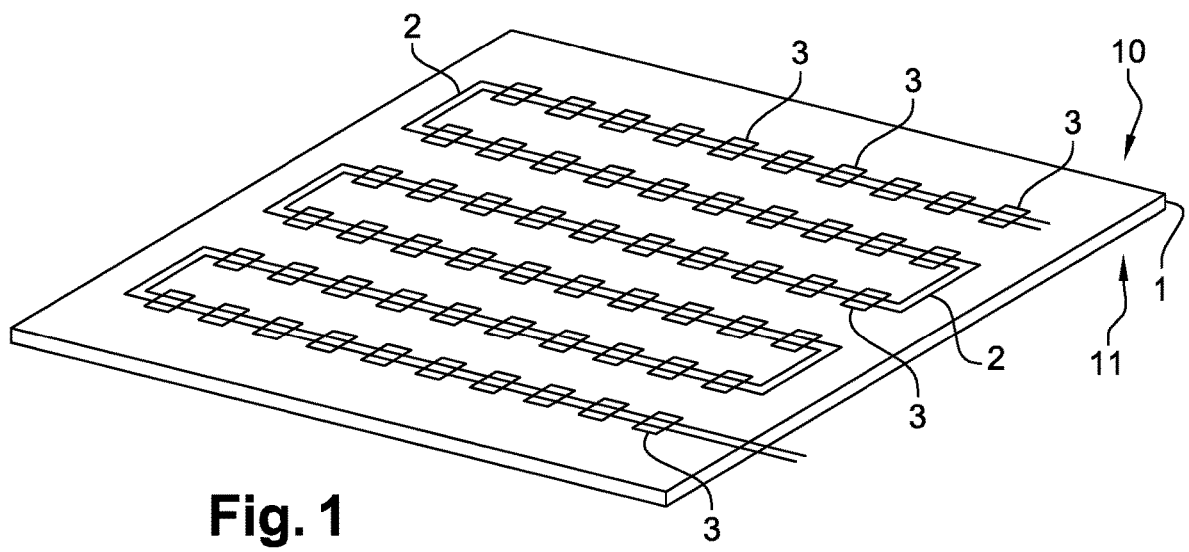
FIG. 1 is a detailed simplified representation of a light-emitting device according to an embodiment of the invention.

FIG. 1 illustrates a light radiation emitting device according to an embodiment of the invention, where LED-type devices 3 are assembled in parallel on a side of a flexible support 1. Each LED device 3 generally comprises two electrical contact pads which may be formed on a same side of a substrate or of an electrically-insulating base. LED devices 3 are electrically interconnected, via their contact pads, by means of conductive tracks formed on support 1. The conductive tracks may in particular be formed by embedding of conductive wires 2 within the thickness of support 1 from the side receiving LED devices 3. The conductive tracks may also be formed by simple gluing of the conductive wires to the support.

Figure 2:
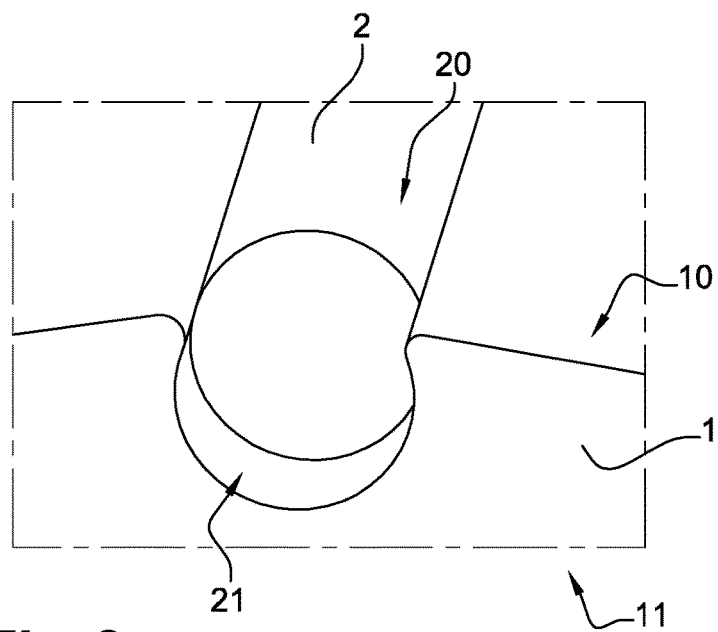
FIG. 2 is a cross-section view of a simplified representation of the embedding of a conductive wire within the thickness of a support, according to a specific embodiment of the invention.

A conductive wire embedded in the support according to an embodiment is illustrated in FIG. 2. Support 1 thus has two opposite sides, a first side 10 and a second side 11, delimiting the support thickness. For example, first side 10 of support 1 is intended to receive the components to be interconnected, and in particular the LED devices. A conductive wire 2 is inserted, along all or part of its length, across the thickness of support 1 from first side 10. The depth of the embedding is such that a portion of wire 2 remains exposed on first side 10 of support 1. In other words, conductive wire 2 comprises a portion 20 called "contact portion" exposed on first side 10 of support 1 and another portion 21 arranged under first side 10 of support 1. Contact portion 20 is intended to be connected to the contact pads of LED luminous devices 3.

In practice, the contact portions 20 of conductive wires 2 may be flush with the surface of first side 10 of support 1 or may protrude from the surface of first side 10, as illustrated in FIG. 1. Both configurations allow a direct connection of the components to the conductive track.

Thus, it is sufficient to place each of the contact pads of the LED devices opposite a contact portion of one of the conductive wires of the conductive track, and to connect the contact pads to the respective contact portions to ensure the electric interconnection between LED luminous devices. For example, the direct connection of a contact pad to a contact portion may be performed by thermocompression bonding.

Figure 3A:
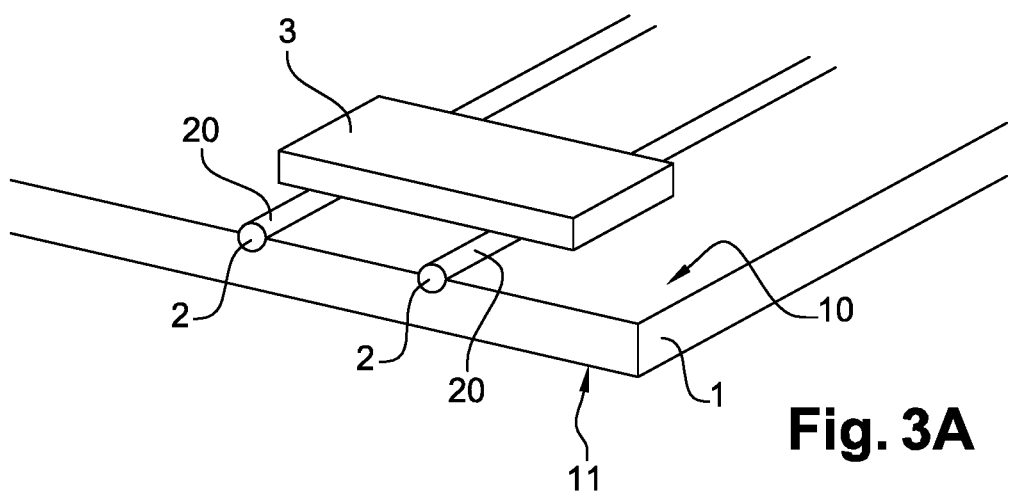
FIG. 3A is a simplified representation of a light-emitting device according to an embodiment of the invention, where the luminous device is positioned on the contact portions of the conductive wires.
Figure 3B:
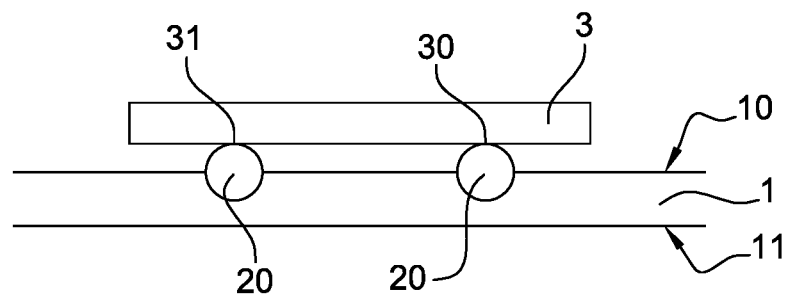
FIG. 3B is a partial cross-section view of the device of FIG. 3A.

According to an embodiment illustrated in FIGS. 3A and 3B, LED device 3 may be arranged on the surface of first side 10 of support 1, above contact portions 20, in the direction from second side 11 to first side 10, and the contact pads 30, 31 of LED device 3 are in direct contact with the contact portions 20 of conductive wires 2.

In terms of process, the following steps can be envisaged:
- first, forming the conductive track by embedding conductive wires within the thickness of the support from the first side of the support and according to a predefined interconnection pattern;
- then, assembling the LED devices on the first side of the support by arranging the connection areas opposite the contact portions and connecting the contact pads to the connection portions, for example, by thermocompression.

Figure 4:
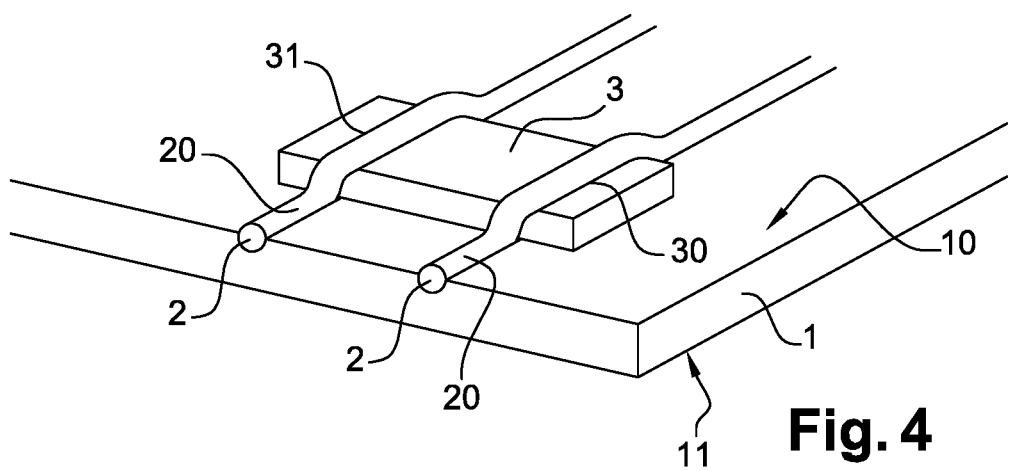
FIG. 4 is a simplified representation of a light-emitting device according to another embodiment of the invention, where the luminous device is positioned under the contact portions of the conductive wires.

According to a variation illustrated in FIG. 4, LED device 3 may be arranged on the surface of first side 10 of support 1, above contact portion 20, in the direction from second side 11 to first side 10. Contact pads 30, 31 of LED device 3 are also in direct contact with the contact portions 20 of conductive wires 2. In this specific case, wires 2 are embedded within the thickness of the support along part of their length, contact portions 20 overlapping the contact pads of LED device 3.

Figure 6:
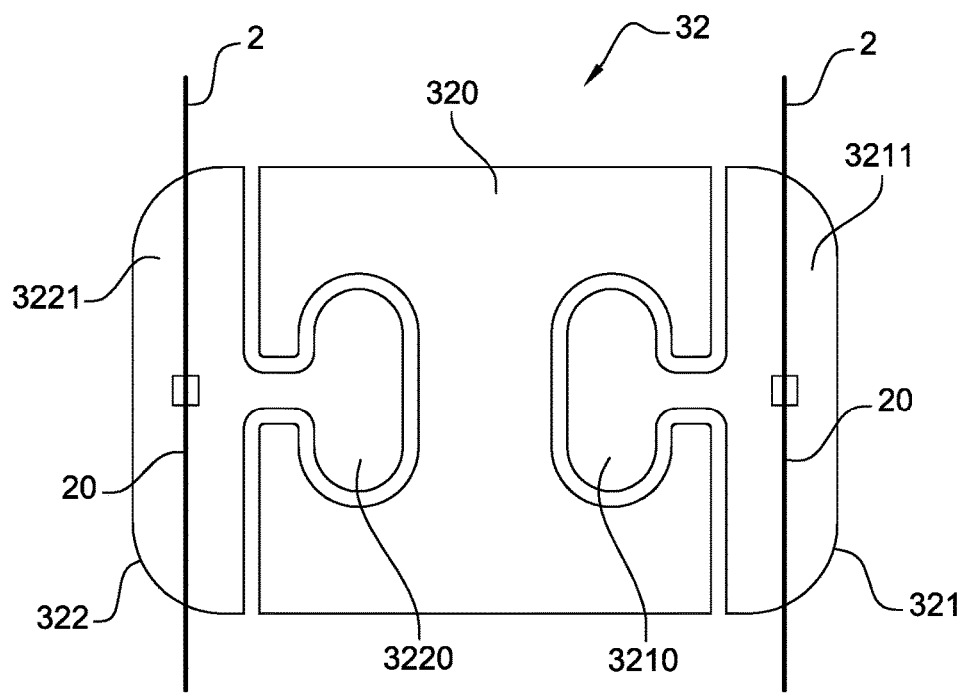
FIG. 6 is a simplified representation of the back side of a LED module integrating contact fins, according to another embodiment of the invention.

According to another variation, it is also possible to provide contact pads having a smaller thickness than the central body of the LED device to limit the total thickness of the product and or also to enable to modify or adjust the luminous flux output angles. For example, the contact pads of the LED luminous device may appear in the form of fins extending laterally from the central body. In practice, the LED device may comprise a support adapted for a thermocompression bonding having one or a plurality of LED chips or modules positioned thereon. The substrate comprises at least one structure receiving one or a plurality of LED chips or one or a plurality of LED modules, and connection structures configured to ensure the electric connection between the LED chips or modules and the conductive track, via the weld bonding, for example. An example of such a LED support is illustrated in FIG. 6. Substrate 32 has a central structure 320 intended to receive at least one LED chip, as well as two substantially identical lateral structures 321, 322. An example of such an embodiment is illustrated in FIG. 6. Each lateral structure 321, 322 appears in the form of a fin and is formed of a first portion 3210, 3220 and of a second portion 3211, 3221. First portion 3210, 3220 is intended to be electrically coupled to one of the electrodes of the LED chip, and the second portion 3211, 3221 forms the contact pad and is intended to be connected to one of the contact portions 20 of one of the conductive wires 2 of the conductive track. Of course, the specific design illustrated in FIG. 6 is only given as an example, and other shapes and layouts can be envisaged. Further, it is also possible to have a plurality of LED chips or modules of same type or of different types, on a same central structure, each electrode of each of the LED chips being electrically coupled to one of the lateral structures.

In terms of process, the following steps can be envisaged:
- first, assembling the LED devices to the support;
- then, forming the conductive track by embedding of conductive wires within the support thickness according to a predefined interconnection pattern, including the connection of the contact portions of the conductive wires to the contact pads of the LED devices.

Figure 5A:
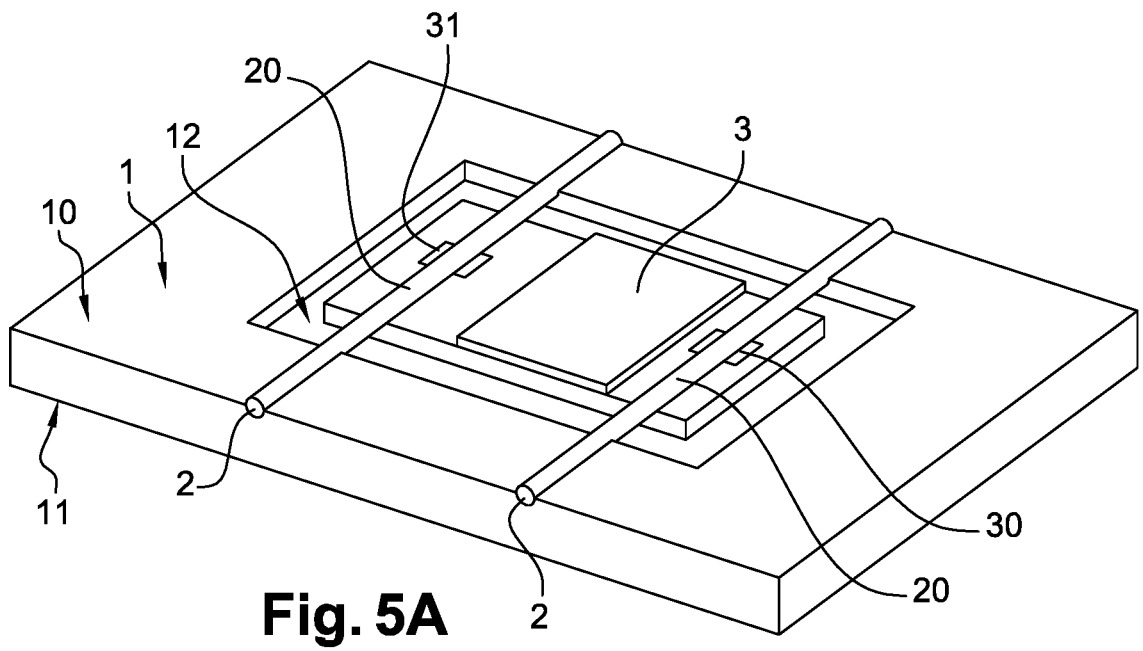
FIG. 5A is a simplified representation of a light-emitting device according to another embodiment of the invention, where the luminous device is positioned in a housing of the support.

According to another embodiment, the LED device may be arranged in a housing 12 formed within the thickness of support 1, housing 12 being open on the first side 10 of support 1. Similarly, as for the previous embodiment, the LED devices may be connected to the conductive track so that contact portions 20 are located on contact pads 30, 31 as illustrated in FIG. 5A. The electric connection between the contact portions and the contact pads may be achieved by any adapted means, particularly by gluing, thermocompression bonding, or snap coupling. Further, it is also possible to envisage the embedding or the gluing of the conductive wires in the bottom of the housing. In this case, the contact pads of the LED luminous device arranged in the housing may be arranged on the contact portions. In practice, the housing is generally formed before the embedding or the gluing of the conductive wires in the support.

Figure 5B:
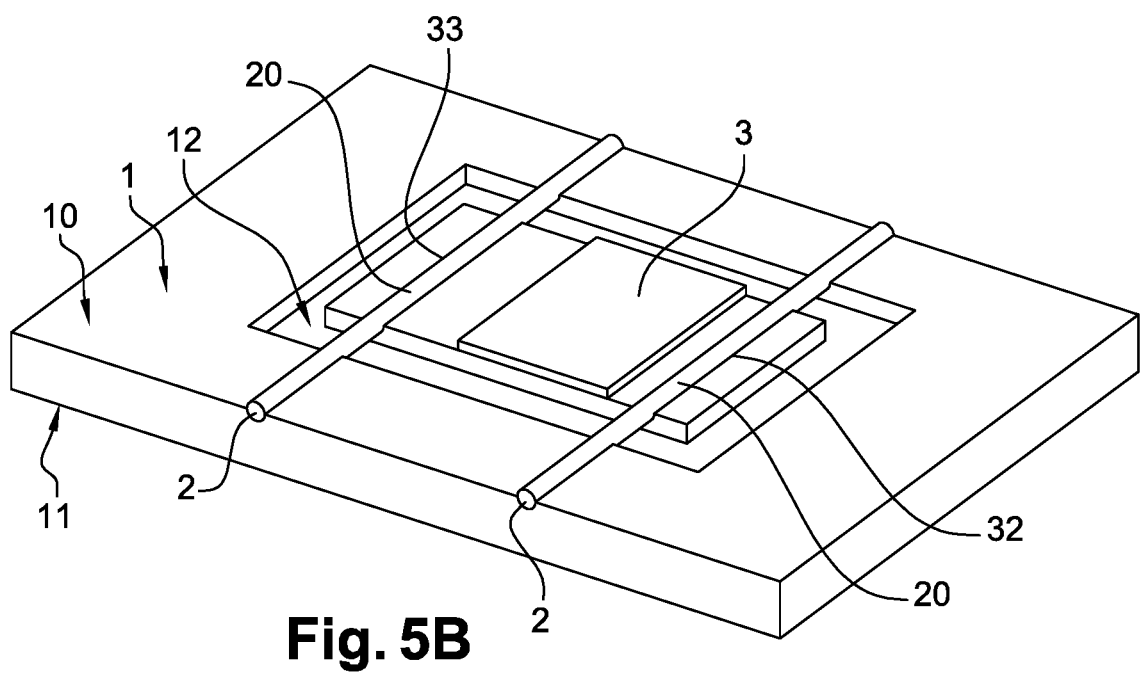
FIG. 5B is a simplified representation of a light-emitting device according to another embodiment of the invention, the contact portions are engaged in the contact pads.

As illustrated in FIG. 5B, it is also possible to provide a fastening and a connection of the LED device by snap coupling of the contact portions to the contact pads. For example, each contact pad may comprise a groove 32, 33 sized and configured to receive and maintain a contact portion. The groove may in particular be covered with a conductive layer. Thus, it is sufficient to engage the contact portions into the grooves to ensure both the connection and the fastening of the contact portions to the contact pads.

The use of conductive wires also enables to directly include components, such as resistors or heat sinks, on the tracks. Indeed, such components may be formed by a portion of a conductive wire coupling or not two LED devices.

Further, it may also be advantageous to use a sheathed conductive wire, such as for example a conductive wire made of enameled copper, since it is in this case possible to form tracks including wire overlaps. The removal of the insulating layer may be obtained at the time of the electric connection of the contact pads to the contact portions by thermocompression bonding.

Of course, it is possible to arrange a plurality of LED devices, assembled in series and/or in parallel together, on a same support.

In practice, it is possible to route the two opposite sides of the support by embedding or gluing of conductive wires according to one of the above-described variations. It is also possible to provide housings crossing the support thickness where the contact portions are exposed, and to directly connect the LED devices to the contact portions in the housings. It is thus possible to arrange LED devices on the two opposite sides of the support and to thus form objects emitting in a plurality of directions.

Figure 7:
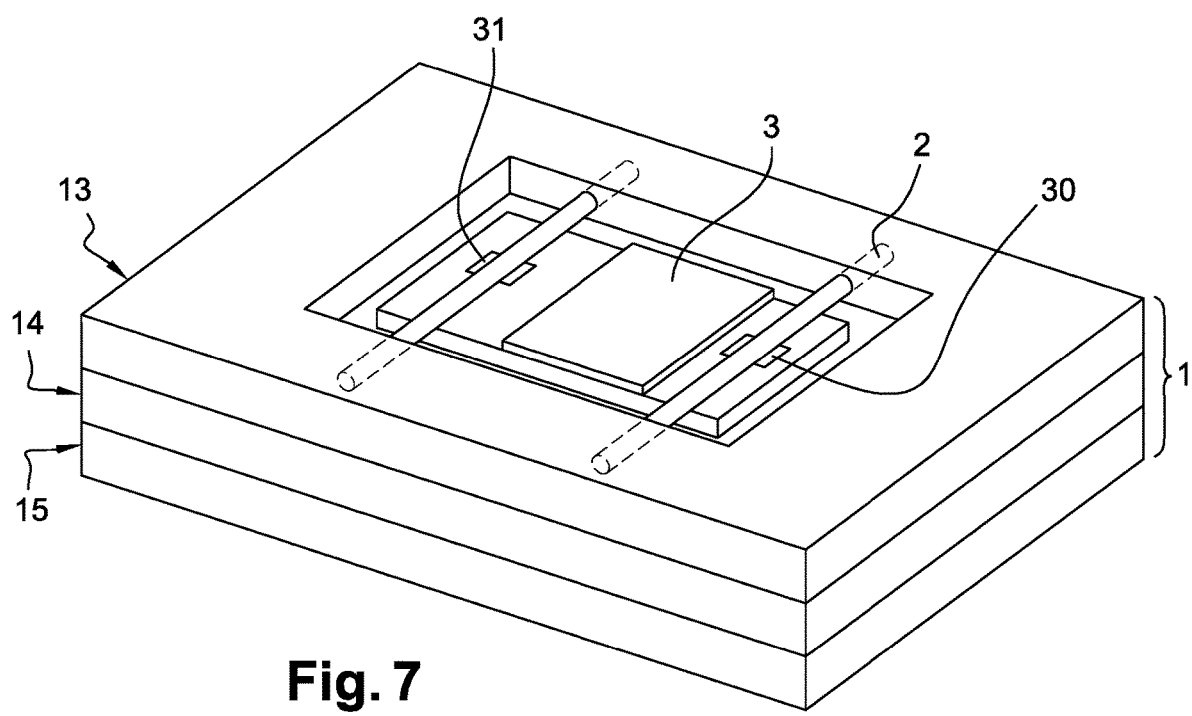
FIG. 7 is a simplified representation of a light-emitting device according to another embodiment of the invention.

According to another embodiment illustrated in FIG. 7, support 1 may be formed of a first layer 13 integrating conductive wires 2 and LED devices 3, a second layer 14 on one of the surfaces of the first layer, behaving as a waveguide surface for light radiations generated by the LED devices, and a third layer 15 arranged on second layer 14 and used as a light radiation output surface. First and second layers 13, 14 may form a single layer playing the role of a waveguide and integrating the conductive wires. According to a variation, the extraction of light radiations may be performed via the lateral surfaces of second layer 14. It is also possible to hide all or part of the lateral surfaces of second layer 14, via for example caches supporting reflective surfaces. In this case, light radiations may be extracted via the third layer, which may be provided with perforations, or which has optical properties enabling, for example, to obtain diffuse light.

Figure 8:
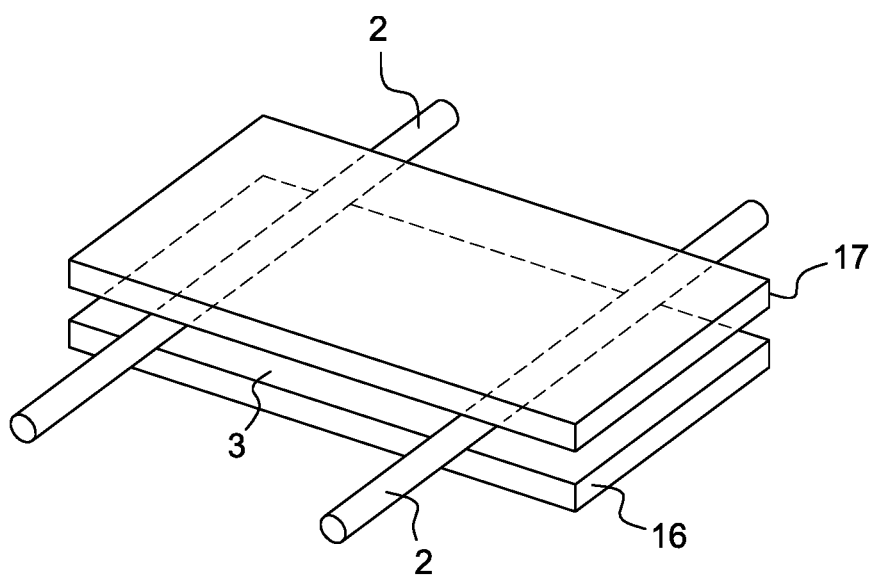
FIG. 8 is a simplified representation of a light-emitting device according to another embodiment of the invention.

In another embodiment illustrated in FIG. 8, conductive wires 2 as well as a LED device are sandwiched between two substrates 16, 17. The support may be formed by the two substrates 16, 17 or may be formed by one of the two substrates 16, 17. Conductive wires 2 may be formed on first substrate 16 by simple gluing of the wires to first substrate 16. The device may be connected to the contact portions of the wires via one of the above-disclosed variations, that is, by weld bonding or by gluing. Second substrate 17 may totally cover the conductive wires and the LED device. In this case, it is preferable for at least one of the two substrate, for example, the second substrate, to have optical properties for example authorizing the transmission of all or part of the light radiations emitted by the LED device. It is also possible to provide a window in one or the other of the two substrates, opposite the LED device to allow the passing of light radiations.

The solution comprising forming conductive tracks by the use of conductive wires, via a gluing or an embedding of conductive wires, thus provides a large flexibility in the pattern of the conductive tracks as well as in the assembly and the interconnection of the LED luminous devices on the tracks.

According to an embodiment illustrated in FIGS. 9A to 11A, it is possible to route the conductive tracks in such a way as to authorize a deformation of the support (1) with no conduction rupture in the conductive track. For this purpose, a so-called "deformable" area (18), for example, stretchable, may in particular be provided on the support (1) having the conductive wires of the conductive track positioned therein according to a pattern (21) which authorizes a deformation of the track in a desired direction with no risk of breakage of the conductive wires. In the examples illustrated in FIGS. 9A, 10A, and 11A, the conductive wires have, in addition to the contact portions intended to be placed in contact with electric components, such as the LED-type device (3), portions routed according to a specific pattern, for example, in zigzag (21), on the support (1). Of course, other routing patterns are possible according to the envisaged deformations. As illustrated in FIGS. 9B, 10B, and 11B, during the deformation of the support in the envisaged direction, the conductive track follows the deformations of the support with no line breakage due to the routing patterns. For example, in FIG. 9B, the patterns are configured to authorize the stretching of the stretchable area in direction X substantially parallel to the sides of the support. Of course, areas stretchable in direction Y perpendicular to direction X can also be envisaged. It is thus possible to envisage, for a same stretchable area, different stretching directions (FIG. 10B) and particularly direction Z perpendicular to the previous directions X and Y, to form volume structures. For example, stretchable areas may be located between two or a plurality of LEDs or any other electronic component. It is thus possible to form flexible luminous devices capable of adapting to specific curvatures.

The solution of the present invention is particularly adapted to the forming of a light radiation emitting device having micrometer-range dimensions or not. In particular, the solution is well adapted for the assembly of LED devices on a printed circuit formed of a flexible or rigid support. The solution provides a great flexibility in terms of support type, shape, and dimension, of interconnection diagram, of density of LED devices to be assembled.

The invention claimed is:

1. A light radiation emitting device, comprising:
at least one LED-type device capable of generating a light radiation in a predefined wavelength range and comprising at least two electrical contact pads;
a support delimited by opposite first and second sides defining together a thickness of the support, said support supporting at least said LED-type device and at least one electrically-conductive track;
wherein the electric track is formed of conductive wires, all or part of the conductive wires having at least one contact portion exposed towards at least one of the first and second sides of the support;
wherein each of the contact pads of the LED-type device is positioned opposite a contact portion of one of the conductive wires and is electrically connected to said contact portion;
wherein the LED-type device is formed of a substrate comprising at least one central reception section and at least one pair of lateral connection sections, the central reception section of the substrate receiving at least one LED chip or module, and each lateral connection section of the substrate being formed of at least a first portion forming one block with a second portion, said first portion of each of the lateral connection sections being electrically coupled to one of the electrodes of the LED chip or module, and the second portion of each of the lateral connection sections forming one of said contact pads connected to one of the contact portions of one of the conductive wires of the conductive track;
wherein each conductive wire is embedded, along its entire length, in an embedment surface formed by the first or the second side of the support, such that the conductive wire protrudes inwardly from the embedment surface into the thickness of the support and protrudes outwardly away from the embedment surface;
wherein the contact portions of each conductive wire are available to be electrically connected.

2. The device of claim 1, characterized in that the support is deformable in at least one deformation direction and wherein a portion of at least one of said conductive wires is positioned according to a pattern authorizing the deformation of the support and of the conductive track in said deformation direction, with no breakage of the conductive wires.

3. The device of claim 1, characterized in that the support is provided with at least one housing open on at least one of the sides of the support, said housing comprising at least said LED-type device and at least the contact portions to which said LED-type device is connected.

4. The device of claim 1, characterized in that the support is formed of two substrates enclosing the conductive wires, and in that at least one of the two substrates comprises at least one recess authorizing said exposure of the contact portions, said LED device being positioned inside of said recess.

5. The device of claim 1, characterized in that the conductive track comprises at least one resistor and/or one heat sink formed by at least one of the conductive wires.

6. The device of claim 1, characterized in that each conductive wire is covered with an insulating sheath, the contact portions connected to the contact pads of the LED luminous device or to the electrodes of the LED chip, having no insulating sheath.

7. The device of claim 1, characterized in that it comprises a keying system configured to allow a correct positioning of the LED-type devices on the support.

8. A mechanical device comprising a printed circuit with at least one light radiation emitting device of claim 1.

9. A method of manufacturing the light-emitting device of claim 1, characterized in that it comprises:
    forming at least one conductive track in a support according to an interconnection pattern, the support being delimited by first and second opposite sides defining together a thickness of the support, all or part of the conductive wires having at least one contact portion exposed towards at least one of the first and second sides of the support, wherein each conductive wire is embedded, along its entire length, in an embedment surface formed by the first or the second side of the support, such that the conductive wire protrudes inwardly from the embedment surface into the thickness of the support and protrudes outwardly away from the embedment surface, and wherein the contact portions of each conductive wire are available to be electrically connected;
    forming at least one LED-type device with a substrate comprising at least one central reception section and at least one pair of lateral connection section, the central reception section of the substrate receiving at least one LED chip or module, and each lateral connection section of the substrate being formed of at least a first portion forming one block with a second portion, said first portion of each of the lateral connection sections being electrically coupled to one of the electrodes of the LED chip or module, and the second portion of each of the lateral connection sections forming one of said contact pads to be connected to one of the contact portions of one of the conductive wires of the conductive track;
    assembling and connecting to the conductive track at least one LED-type device capable of generating a light radiation in a predefined wavelength range and comprising two electrical contact pads, each of the contact pads of the LED-type device being placed opposite a contact portion of one of the conductive wires and being electrically connected to said contact portion.

10. The manufacturing method of claim 9, characterized in that the forming of the conductive track comprises forming on the support an area deformable in at least one deformation direction and wherein a portion of at least one of said conductive wires is positioned according to a pattern authorizing the deformation of said deformable area and of the conductive track in said deformation direction with no breakage of the conductive wires.

* * * * *